US009589620B1

(12) United States Patent
Naeimi

(10) Patent No.: US 9,589,620 B1
(45) Date of Patent: Mar. 7, 2017

(54) DESTRUCTIVE READS FROM SPIN TRANSFER TORQUE MEMORY UNDER READ-WRITE CONDITIONS

(71) Applicant: Intel Corporation, Santa Clara, CA (US)

(72) Inventor: Helia Naeimi, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/864,564

(22) Filed: Sep. 24, 2015

(51) Int. Cl.
*G11C 11/00* (2006.01)
*G11C 11/16* (2006.01)
*G11C 13/00* (2006.01)

(52) U.S. Cl.
CPC ...... *G11C 11/1675* (2013.01); *G11C 11/1673* (2013.01); *G11C 11/1693* (2013.01); *G11C 13/0004* (2013.01)

(58) Field of Classification Search
CPC .................. G11C 13/004; G11C 11/1673
USPC .................................... 365/148, 158
See application file for complete search history.

(56) References Cited

U.S. PATENT DOCUMENTS

| 5,724,294 A * | 3/1998 | Khieu ............... | G11C 7/14 365/190 |
| 8,625,361 B2 * | 1/2014 | Chiu ................. | G11C 8/16 365/189.04 |
| 2015/0070971 A1 * | 3/2015 | Katayama ........... | G11C 13/004 365/148 |
| 2015/0206567 A1 * | 7/2015 | Bose ................. | G11C 7/04 365/158 |

OTHER PUBLICATIONS

Giles et al., "Wrapping Operations for Atomicity and Durability", IEEE HPEC '14, Sep. 2014, 2 pages, IEEE.
Karnagel et al., "Improving In-memory Index Performance with Intel TSX", HPCA 2014, Feb. 15, 2014, 12 pages, IEEE.
Kleen, "Scaling Existing Lock-based Applications with Lock Elision", ACMQueue, 2013, 8 pages, ACM.
Yoo et al., "Early Experience on Transactional Execution of Java Programs Using Intel Transactional Synchronization Extensions", TRANSACT 2014 9th ACM SIGPLAN Workshop on Transactional Computing, Mar. 2014, 10 pages, ACM.
Wikipedia, "Magnetoresistive Random-Access Memory", Wikipedia: The Free Encyclopedia, retrieved Aug. 18, 2015, 10 pages.
Wikipedia, "Spin-Transfer Torque", Wikipedia: The Free Encyclopedia, retrieved Jul. 23, 2015, 3 pages.

* cited by examiner

*Primary Examiner* — Pho M Luu
(74) *Attorney, Agent, or Firm* — Jordan IP Law, LLC

(57) ABSTRACT

Systems, apparatuses and methods may provide for detecting a read-write condition in which a read operation from a location in magnetoresistive memory such as spin transfer torque (STT) memory is to be followed by a write operation to the location. Additionally, a current level associated with the read operation may be increased, wherein the read operation is conducted from the location at the increased current level. In one example, the increased current level causes a reset of all bits in the location.

13 Claims, 2 Drawing Sheets

DESTRUCTIVE READS FROM SPIN TRANSFER TORQUE MEMORY UNDER READ-WRITE CONDITIONS

TECHNICAL FIELD

Embodiments generally relate to memory structures. More particularly, embodiments relate to destructive reads from spin transfer torque memory under read-write conditions.

BACKGROUND

Spin transfer torque (STT) is generally an effect in which a magnetic layer in a random access memory (RAM) may be modified using a spin-polarized current. In this regard, electrons have a small amount of angular momentum intrinsic to the electron, wherein a spin polarized current may be a current with more electrons of a particular direction of spin (e.g., more spin-up electrons than spin-down electrons or vice versa). By passing the spin polarized current through a relatively thin magnetic layer, the angular momentum may be transferred to the layer, changing its orientation. Thus, STT may be used to flip the active elements in a magnetic RAM. STT-based write operations, however, may consume a relatively high amount of energy that may in turn have a negative impact on power efficiency and/or battery life.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Magnetoresistive random access memory (MRAM) such as, for example, spin transfer torque (STT) memory may generally provide non-volatility and scalability by using the intrinsic angular momentum of electrons to generate a high-density spin polarized current that flips the active elements in the memory. In some instances, writing to STT memory may involve reading from the target location (e.g., memory address) in question, comparing the read data to the data being written, and only changing the bits in the target location that differ. The initial read operation, however, may increase energy consumption and latency. Techniques described herein may use the detection of read-write conditions to eliminate the energy and latency overhead associated with STT-based write operations and other magnetoresistive memory operations such as, for example, thermal assisted switching MRAM (TAS-MRAM) operations, vertical transport MRAM (VMRAM) operations, and so forth.

Figure 1:
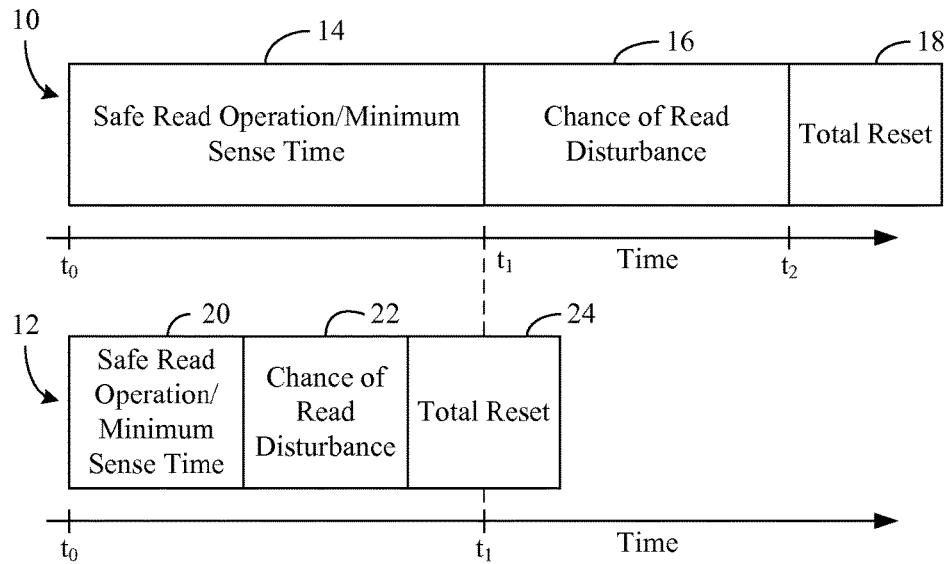
FIG. 1 is an illustration of an example of a time window associated with a read operation according to an embodiment.

Turning now to FIG. 1, a time window is shown for read operations directed to an STT memory address (e.g., target location) in a low current state 10 and alternatively in a high current state 12. More particularly, in the low current state 10, a low current read operation 14 may be safely conducted during a time period between time to and time $t_1$ without concern of one or more read disturbances 16 occurring in the target location. In this regard, the low current read operation 14 may sense the resistance of each cell/bit in the target location by applying a relatively small current to the cells/bits in the target location. If the current is applied for too long (e.g., after time $t_1$), the one or more read disturbances 16 (e.g., the risk of the values of one or more cells/bits unintentionally changing) may occur. Thus, the time period between time $t_0$ and time $t_1$ may be considered the minimum sense time in the low current state 10. Indeed, if the current is applied long enough (e.g., after time $t_2$) a total reset 18 of the target location (e.g., the risk of the values of all cells/bits being erased) may occur.

By contrast, in the high current state 12, a high current read operation 20 may be conducted so that one or more read disturbances 22 and a total reset 24 occur intentionally. As will be discussed in greater detail, the high current state 12 may be used in response to detection of a read-write condition in which a read operation from the target location is to be followed by a write operation to the location. Such a condition may exist, for example, when there is a pending writeback of data (e.g., previously modified data) currently stored in the location in conjunction with a cache miss with respect to other data associated with the write operation (e.g., causing the other data to be written from main memory to the target location). In such a case, the increased current level may cause a reset of all bits in the target location. Moreover, the write operation may be conducted only with respect to bits that differ from the reset bits in the target location. Of particular note is that the energy associated with the increased read current level may be offset by the energy savings associated with writing to only a subset of the total number of bits in the target location. Indeed, the illustrated high current state 12 may substantially enhance overall power efficiency and extend battery life. Additionally, write latencies may be substantially decreased by forcing the reset 24 to occur sooner in time (e.g., reducing the time window associated with the read operation).

Figure 2:
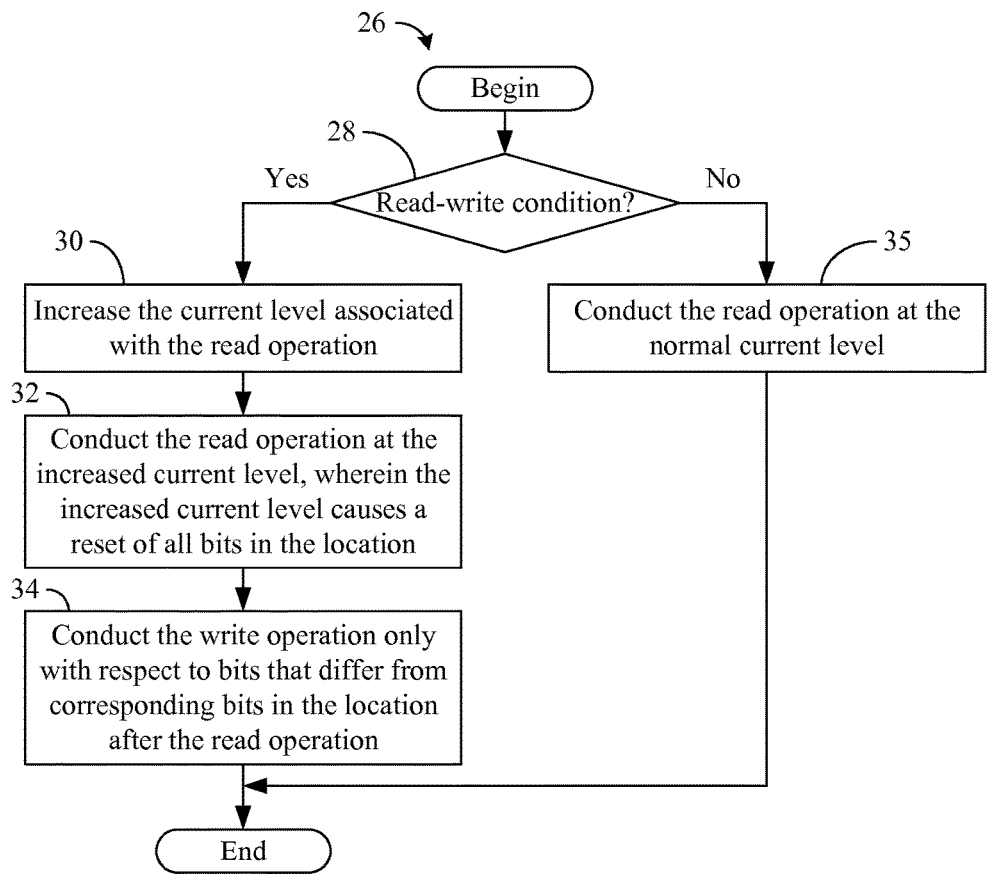
FIG. 2 is a flowchart of an example of a method of operating a memory controller apparatus according to an embodiment.

FIG. 2 shows a method 26 of operating a memory controller apparatus. The method 26 may be implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as, for example, application specific integrated circuit (ASIC), complementary metal oxide semiconductor (CMOS) or transistor-transistor logic (TTL) technology, or any combination thereof. For example, computer program code to carry out operations shown in method 26 may be written in any combination of one or more programming languages, including an object oriented programming language such as JAVA, SMALLTALK, C++ or the like and conventional procedural programming languages, such as the "C" programming language or similar programming languages.

Illustrated processing block 28 provides for determining whether a read-write condition exists with respect to a STT memory. Block 28 may detect, for example, that a read operation from a location in the STT memory is to be followed by a write operation to the same location. More particularly, block 28 might detect a pending writeback with respect to first data (e.g., previously modified data) associated with the read operation and detecting a cache miss with respect to second data associated with the write operation. If the read-write condition is detected at block 28, block 30 may increase a current level associated with the read operation, wherein the read operation may be conducted at the increased current level at block 32. The increased current level may cause a reset of all bits in the location. The read operation may therefore confirm that the reset has taken place by determining the resistance of each bit in the location. Block 32 may also provide for reducing the time window associated with the read operation (e.g., resulting in a relatively short pulse of energy). Additionally, illustrated block 34 identifies one or more bits associated with the write operation that differ from corresponding bits in the location after the read operation and conducts the write operation only with respect to the identified one or more bits. If the read-write condition is not detected at block 28, illustrated block 35 conducts the read operation at the normal current level. The increased and normal current levels may vary depending on the circumstances (e.g., power supply configuration, power management policy, etc.).

Figure 3:
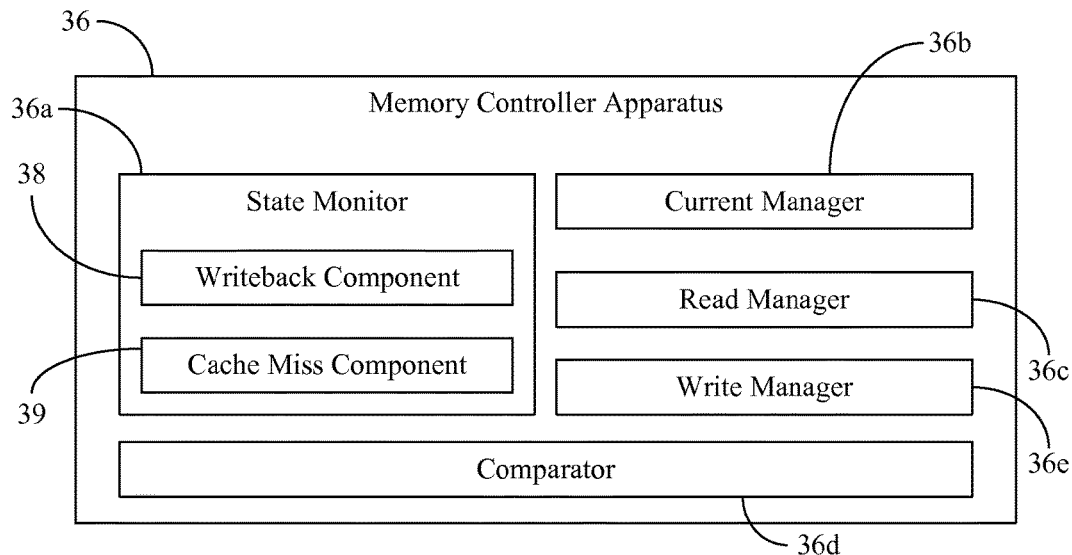
FIG. 3 is a block diagram of an example of a memory controller apparatus according to an embodiment.

Turning now to FIG. 3, a memory controller apparatus 36 (36a-36e) is shown. The memory controller apparatus 36 (e.g., cache controller) may generally implement one or more aspects of the method 26 (FIG. 2), already discussed. In the illustrated example, a state monitor 36a detects a read-write condition in which a read operation from a location in STT memory is to be followed by a write operation to the location. The state monitor 36a may include, for example, a writeback component 38 to detect a pending writeback with respect to first data associated with the read operation and a cache miss component 39 to detect a cache miss with respect to second data associated with the write operation. The first data may be previously modified data (e.g., dirty line eviction).

The apparatus 36 may also include a current manager 36b to increase a current level associated with the read operation. The current manager 36b might include, for example, an amplifier or other suitable current controller. The illustrated apparatus 36 also includes a read manager 36c to conduct the read operation from the location at the increased current level. The increased current level may intentionally cause a total reset of all bits in the location. In one example, the read manager 36c also reduces the time window associated with the read operation. Moreover, a comparator 36d may identify one or more bits associated with the write operation that differ from corresponding bits in the location after the read operation, wherein a write manager 36e may conduct the write operation only with respect to the identified one or more bits.

Figure 4:
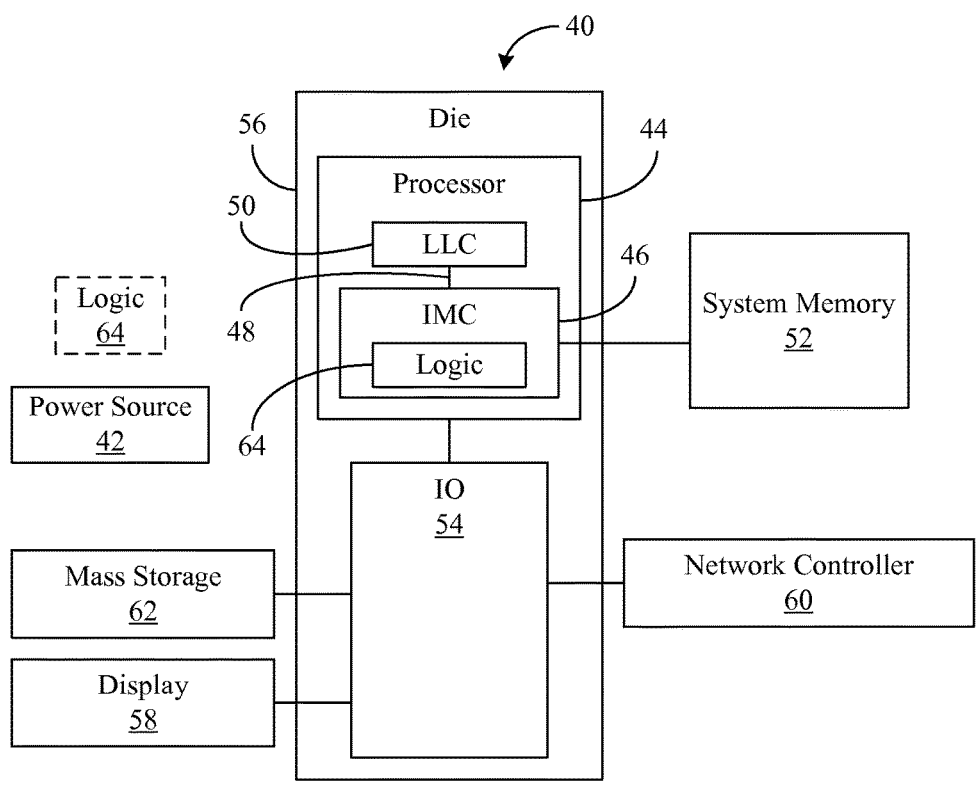
FIG. 4 is a block diagram of an example of a computing system according to an embodiment.

FIG. 4 shows a scalability-enhanced computing system 40. The computing system 40 may generally be part of an electronic device/platform having computing functionality (e.g., personal digital assistant/PDA, notebook computer, tablet computer, server), communications functionality (e.g., smart phone), imaging functionality, media playing functionality (e.g., smart television/TV), wearable functionality (e.g., watch, eyewear, headwear, footwear, jewelry), vehicular functionality (e.g., car, truck, motorcycle, etc., or any combination thereof. In the illustrated example, the system 40 includes a power source 42 to supply power to the system 40 and a processor 44 having an integrated memory controller (IMC) 46, which may use a bus 48 to communicate with a last level cache 50 (LLC). The IMC 46 may also communicate with system memory 52. The LLC 50 may include a magnetoresistive memory such as, for example, spin transfer torque (STT) memory, thermal assisted switching memory, vertical transport memory, etc., and the system memory 52 may include, for example, volatile dynamic RAM (DRAM) configured as one or more memory modules such as, for example, dual inline memory modules (DIMMs), small outline DIMMs (SODIMMs), etc.

The illustrated system 40 also includes an input output (10) module 54 implemented together with the processor 44 on a semiconductor die 56 as a system on chip (SoC), wherein the IO module 54 functions as a host device and may communicate with, for example, a display 58 (e.g., touch screen, liquid crystal display/LCD, light emitting diode/LED display), a network controller 60, and mass storage 62 (e.g., hard disk drive/HDD, optical disk, flash memory, etc.). The IMC 46 may include logic 64 that detects a read-write condition in which a read operation from a location in the LLC 50 is to be followed by a write operation to the location, increase a current level associated with the read operation, and conduct the read operation from the location at the increased current level. Thus, the logic 64 may enable the IMC 46 to function similarly to the memory controller apparatus 36 (FIG. 3) and may implement one or more aspects of the method 26 (FIG. 2), already discussed. The logic 64, which may be implemented in logic instructions, configurable logic and/or fixed-functionality logic hardware, may optionally be implemented elsewhere in the system 40.

Additional Notes and Examples

Example 1 may include a scalability-enhanced computing system comprising a magnetoresistive memory, a bus coupled to the magnetoresistive memory, and a memory controller apparatus coupled to the bus, the memory controller apparatus comprising a state monitor to detect a read-write condition in which a read operation from a location in the magnetoresistive memory is to be followed by a write operation to the location, a current manager to increase a current level associated with the read operation, and a read manager to conduct the read operation from the location at the increased current level.

Example 2 may include the system of Example 1, wherein the increased current level is to cause a reset of all bits in the location.

Example 3 may include the system of Example 1, wherein the read manager is to reduce a time window associated with the read operation.

Example 4 may include the system of Example 1, wherein the state monitor includes a writeback component to detect a pending writeback with respect to first data associated with the read operation, and a cache miss component to detect a cache miss with respect to second data associated with the write operation.

Example 5 may include the system of Example 4, wherein the first data is to be previously modified data.

Example 6 may include the system of any one of Examples 1 to 5, wherein the memory controller apparatus further includes a comparator to identify one or more bits associated with the write operation that differ from corresponding bits in the location after the read operation, and a write manager to conduct the write operation only with respect to the identified one or more bits.

Example 7 may include the system of any one of Examples 1 to 5, wherein the magnetoresistive memory includes a spin transfer torque memory.

Example 8 may include a memory controller apparatus comprising a state monitor to detect a read-write condition in which a read operation from a location in magnetoresistive memory is to be followed by a write operation to the location, a current manager to increase a current manager to increase a current level associated with the read operation, and a read manager to conduct the read operation from the location at the increased current level.

Example 9 may include the apparatus of Example 8, wherein the increased current level is to cause a reset of all bits in the location.

Example 10 may include the apparatus of Example 8, wherein the read manager is to reduce a time window associated with the read operation.

Example 11 may include the apparatus of Example 8, wherein the state monitor includes a writeback component to detect a pending writeback with respect to first data associated with the read operation, and a cache miss component to detect a cache miss with respect to second data associated with the write operation.

Example 12 may include the apparatus of Example 11, wherein the first data is to be previously modified data.

Example 13 may include the apparatus of any one of Examples 8 to 12, further including a comparator to identify one or more bits associated with the write operation that differ from corresponding bits in the location after the read operation, and a write manager to conduct the write operation only with respect to the identified one or more bits.

Example 14 may include a method of operating a memory controller apparatus, comprising detecting a read-write condition in which a read operation from a location in magnetoresistive memory is to be followed by a write operation to the location, increasing a current level associated with the read operation, and conducting the read operation from the location at the increased current level.

Example 15 may include the method of Example 14, wherein the increased current level causes a reset of all bits in the location.

Example 16 may include the method of Example 14, further including reducing a time window associated with the read operation.

Example 17 may include the method of Example 14, wherein detecting the read-write condition includes detecting a pending writeback with respect to first data associated with the read operation, and detecting a cache miss with respect to second data associated with the write operation.

Example 18 may include the method of Example 17, wherein the first data is previously modified data.

Example 19 may include the method of any one of Examples 14 to 18, further including identifying one or more bits associated with the write operation that differ from corresponding bits in the location after the read operation, and conducting the write operation only with respect to the identified one or more bits.

Example 20 may include at least one non-transitory computer readable storage medium comprising a set of instructions, which when executed by a computing device, cause the computing device to detect a read-write condition in which a read operation from a location in magnetoresistive memory is to be followed by a write operation to the location, increase a current level associated with the read operation, and conduct the read operation from the location at the increased current level.

Example 21 may include the at least one non-transitory computer readable storage medium of Example 20, wherein the increased current level is to cause a reset of all bits in the location.

Example 22 may include the at least one non-transitory computer readable storage medium of Example 20, wherein the instructions, when executed, cause a computing device to reduce a time window associated with the read operation.

Example 23 may include the at least one non-transitory computer readable storage medium of Example 20, wherein the instructions, when executed, cause a computing device to detect a pending writeback with respect to first data associated with the read operation, and detect a cache miss with respect to second data associated with the write operation.

Example 24 may include the at least one non-transitory computer readable storage medium of Example 23, wherein the first data is to be previously modified data.

Example 25 may include the at least one non-transitory computer readable storage medium of any one of Examples 20 to 24, wherein the instructions, when executed, cause a computing device to identify one or more bits associated with the write operation that differ from corresponding bits in the location after the read operation, and conduct the write operation only with respect to the identified one or more bits.

Example 26 may include a memory controller apparatus comprising means for detecting a read-write condition in which a read operation from a location in magnetoresistive memory is to be followed by a write operation to the location, means for increasing a current level associated with the read operation, and means for conducting the read operation from the location at the increased current level.

Example 27 may include the apparatus of Example 26, wherein the increased current level is to cause a reset of all bits in the location.

Example 28 may include the apparatus of Example 26, further including means for reducing a time window associated with the read operation.

Example 29 may include the apparatus of Example 26, wherein the means for detecting the read-write condition includes means for detecting a pending writeback with respect to first data associated with the read operation, and means for detecting a cache miss with respect to second data associated with the write operation.

Example 30 may include the apparatus of Example 29, wherein the first data is to be previously modified data.

Example 31 may include the apparatus of any one of Examples 26 to 30, further including means for identifying one or more bits associated with the write operation that differ from corresponding bits in the location after the read operation, and means for conducting the write operation only with respect to the identified one or more bits.

Techniques described herein may therefore improve read-modify-write approaches in order address increased latency and energy associated with extra read operations. The fact that many write operations to each memory level may often be preceded by a read operation may be leveraged to cover high STT-RAM write energy states.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

I claim:

1. A system comprising:
  a magnetoresistive memory;
  a bus coupled to the magnetoresistive memory; and
  a memory controller apparatus coupled to the bus, the memory controller apparatus comprising:
    a state monitor to detect a read-write condition in which a read operation from a location in the magnetoresistive memory is to be followed by a write operation to the location, wherein the state monitor includes:
      a writeback component to detect a pending writeback with respect to first data associated with the read operation, wherein the first data is to be previously modified data; and
      a cache miss component to detect a cache miss with respect to second data associated with the write operation,
    a current manager to increase a current level associated with the read operation,
    a read manager to conduct the read operation from the location at the increased current level,
    a comparator to identify one or more bits associated with the write operation, that differ from corresponding bits in the location after the read operation, and
    a write manager to conduct the write operation only with respect to the identified one or more bits.

2. The system of claim 1, wherein the increased current level is to cause a reset of all bits in the location.

3. The system of claim 1, wherein the read manager is to reduce a time window associated with the read operation.

4. The system of claim 1, wherein the magnetoresistive memory includes a spin transfer torque memory.

5. An apparatus comprising:
  a state monitor to detect a read-write condition in which a read operation from a location in magnetoresistive memory is to be followed by a write operation to the location, wherein the state monitor includes a writeback component to detect a pending writeback with respect to first data associated with the read operation, and a cache miss component to detect a cache miss with respect to second data associated with the write operation, wherein the first data is to be previously modified data;
  a current manager to increase a current level associated with the read operation;
  a read manager to conduct the read operation from the location at the increased current level;
  a comparator to identify one or more bits associated with the write operation that differ from corresponding bits in the location after the read operation; and
  a write manager to conduct the write operation only with respect to the identified one or more bits.

6. The apparatus of claim 5, wherein the increased current level is to cause a reset of all bits in the location.

7. The apparatus of claim 5, wherein the read manager is to reduce a time window associated with the read operation.

8. A method comprising:
  detecting a read-write condition in which a read operation from a location in magnetoresistive memory is to be followed by a write operation to the location, wherein detecting the read-write condition includes:
    detecting a pending writeback with respect to first data associated with the read operation, wherein the first data is previously modified data; and
    detecting a cache miss with respect to second data associated with the write operation;
  increasing a current level associated with the read operation;
  conducting the read operation from the location at the increased current level;
  identifying one or more bits associated with the write operation that differ from corresponding bits in the location after the read operation; and
  conducting the write operation only with respect to the identified one or more bits.

9. The method of claim 8, wherein the increased current level causes a reset of all bits in the location.

10. The method of claim 8, further including reducing a time window associated with the read operation.

11. At least one non-transitory computer readable storage medium comprising a set of instructions, which when executed by a computing device, cause the computing device to:
  detect a read-write condition in which a read operation from a location in magnetoresistive memory is to be followed by a write operation to the location;
  increase a current level associated with the read operation;

conduct the read operation from the location at the increased current level;

detect a pending writeback with respect to first data associated with the read operation, wherein the first data is to be previously modified data;

detect a cache miss with respect to second data associated with the write operation;

identify one or more bits associated with the write operation that differ from corresponding bits in the location after the read operation; and conduct the write operation only with respect to the identified one or more bits.

12. The at least one non-transitory computer readable storage medium of claim 11, wherein the increased current level is to cause a reset of all bits in the location.

13. The at least one non-transitory computer readable storage medium of claim 11, wherein the instructions, when executed, cause a computing device to reduce a time window associated with the read operation.

* * * * *